(12) United States Patent
Deak (10) Patent No.: US 10,845,430 B2
(45) Date of Patent: Nov. 24, 2020

(54) MAGNETORESISTIVE SENSOR WITH COMPENSATING COIL

(71) Applicant: MultiDimension Technology Co., Ltd., Zhangjiagang (CN)

(72) Inventor: James Geza Deak, Zhangjiagang (CN)

(73) Assignee: MultiDimension Technology Co., Ltd., Zhangjiagang (CN)

(*) Notice: Subject to any disclaimer, the term of this patent is extended or adjusted under 35 U.S.C. 154(b) by 32 days.

(21) Appl. No.: 16/307,524

(22) PCT Filed: Jun. 7, 2017

(86) PCT No.: PCT/CN2017/087365
§ 371 (c)(1),
(2) Date: Dec. 6, 2018

(87) PCT Pub. No.: WO2017/211279
PCT Pub. Date: Dec. 14, 2017

(65) Prior Publication Data
US 2019/0346514 A1 Nov. 14, 2019

(30) Foreign Application Priority Data
Jun. 7, 2016 (CN) .......................... 2016 1 0397752

(51) Int. Cl.
*G01R 33/00* (2006.01)
*H01L 43/08* (2006.01)
(Continued)

(52) U.S. Cl.
CPC ...... *G01R 33/0011* (2013.01); *G01R 33/0005* (2013.01); *G01R 33/022* (2013.01);
(Continued)

(58) Field of Classification Search
CPC ............ G01R 33/0011; G01R 33/0005; G01R 33/022; G01R 33/091; G01R 33/095; H01L 43/08; H01L 27/22; H01L 43/12
(Continued)

(56) References Cited

U.S. PATENT DOCUMENTS

2011/0210722 A1 9/2011 Paci et al.
2012/0161759 A1 6/2012 Pozzati et al.
(Continued)

FOREIGN PATENT DOCUMENTS

CN 103091649 * 5/2013 .......... G01R 33/022
CN 103091649 A 5/2013
(Continued)

OTHER PUBLICATIONS

"Chinese Application No. 201610397752.5, First Office Action dated Jul. 2, 2018", (Jul. 2, 2018), 10 pgs.
(Continued)

*Primary Examiner* — Vincent Q Nguyen
*Assistant Examiner* — Trung Nguyen
(74) *Attorney, Agent, or Firm* — Schwegman Lundberg & Woessner, P.A.

(57) ABSTRACT

A magnetoresistive sensor with a compensating coil comprising a silicon substrate, collection of MR sensor units disposed on the silicon substrate, collection of rectangular soft ferromagnetic flux concentrators, serpentine compensating coil, connecting circuit, and collection of bond pads used for electrical connections. The MR sensor units are interconnected to form a push-pull sensor bridge. The MR sensor units are disposed below the gap between two adjacent soft ferromagnetic flux concentrators. The serpentine compensating coil has a positive current strap over the MR sensor units and a negative current strap under the soft ferromagnetic flux concentrators. The MR sensor bridge and the serpentine compensating coil are connected through bond pads and covered with an encapsulation structure. The magnetoresistive sensor also comprises a spiral initialization coil placed on a substrate within the encapsulating structure. A sensor chip is disposed on the initialization coil, which is used for reducing magnetic hysteresis.

14 Claims, 5 Drawing Sheets

(51) Int. Cl.
*G01R 33/022* (2006.01)
*G01R 33/09* (2006.01)

(52) U.S. Cl.
CPC ......... *G01R 33/091* (2013.01); *G01R 33/095* (2013.01); *H01L 43/08* (2013.01)

(58) Field of Classification Search
USPC ........ 324/200, 207.2–207.23, 205, 210, 219, 324/228, 244, 252, 262, 500, 750.12, 324/750.21, 754.17, 754.29
See application file for complete search history.

(56) References Cited

U.S. PATENT DOCUMENTS

| | | |
|---|---|---|
| 2013/0015839 A1 | 1/2013 | Franke |
| 2016/0327617 A1 | 11/2016 | Deak et al. |
| 2017/0176545 A1 | 6/2017 | Deak et al. |
| 2017/0205473 A1 | 7/2017 | Deak et al. |
| 2018/0128887 A1* | 5/2018 | Yuan .................. G01R 33/096 |
| 2018/0149715 A1* | 5/2018 | Deak .................. G01R 33/09 |

FOREIGN PATENT DOCUMENTS

| | | |
|---|---|---|
| CN | 103630855 | 3/2014 |
| CN | 103913709 | 7/2014 |
| CN | 103995240 | 8/2014 |
| CN | 105093139 | 11/2015 |
| CN | 205581283 U | 9/2016 |
| CN | 205720615 U | 11/2016 |
| WO | WO-2005064357 A2 | 7/2005 |
| WO | WO-2017211279 A1 | 12/2017 |

OTHER PUBLICATIONS

"International Application No. PCT/CN2017/087365, International Search Report and Written Opinion dated Sep. 20, 2017", (Sep. 20, 2017), 10 pgs.

"European Application No. 17809718.4, Extended European Search Report dated Nov. 22, 2019", (Nov. 22, 2019), 4 pgs.

* cited by examiner

MAGNETORESISTIVE SENSOR WITH COMPENSATING COIL

PRIORITY CLAIM TO RELATED APPLICATIONS

This application is a U.S. national stage filing under 35 U.S.C. § 371 from International Application No. PCT/CN2017/087365, filed on 7 Jun. 2017, and published as WO2017/211279 on 14 Dec. 2017, which claims the benefit under 35 U.S.C. 119 to Chinese Application No. 201610397752.5, filed on 7 Jun. 2016, the benefit of priority of each of which is claimed herein, and which applications and publication are hereby incorporated herein by reference in their entirety.

TECHNICAL FIELD

The present invention relates to magnetic sensors, and in particular to a magnetoresistive sensor with a compensating coil.

BACKGROUND ART

In many applications, a magnetic sensor needs to be operated in a closed loop to increase the dynamic range, improve the linearity, and decrease the magnetic hysteresis of the sensor. The use of a wafer-level compensating coil allows the magnetic sensor to be easily operated in a closed loop mode.

A typical compensating coil (referred to as a bias strip by Honeywell Inc.) is a large serpentine coil placed on top of a sensor chip substrate, which results in poor space utilization, and thus the actual size of the sensor is much larger than the desired size. An AMR sensor chip from Honeywell Inc. also generates an orthogonal magnetic field by using a bias strip and a reset coil, thereby improving the sensitivity and linearity (a so-called set/reset coil) and providing a capability of operating in a closed loop mode (of the bias strip). However, the AMR sensor has a large device area and high cost.

In the prior art, a spiral initialization coil is used in the utility model patent with Application No. 201620296367.7 and entitled "A MAGNETORESISTIVE SENSOR PACKAGE WITH ENCAPSULATED INITIALIZATION COIL", wherein the initialization coil is disposed on the substrate of the package, thereby reducing the magnetic hysteresis and drift of the sensor.

The present invention provides a wafer-level compensating coil that has efficient space utilization with a magnetoresistive sensor. The compensating coil has a serpentine winding pattern, and is directly formed on a wafer by deposition and etching and used for driving the sensor in a closed loop mode. The magnetoresistive sensor of the present invention is placed on a substrate and encapsulated in an LGA form, where the substrate includes a serpentine initialization coil for controlling magnetic hysteresis. The size of the LGA substrate is not increased due to the initialization coil, and the size of the sensor chip is smaller than if the serpentine compensating coil was formed on it rather than included on the LGA substrate. Therefore, the sensor has improved space utilization and a compact structure, thereby effectively lowering the cost.

SUMMARY OF THE INVENTION

In order to solve the above technical problems, the present invention provides a magnetoresistive sensor with a compensating coil.

The present invention is implemented according to the following technical solution:

A magnetoresistive sensor with a compensating coil, including a silicon substrate, a collection of MR sensor units disposed on the silicon substrate, a collection of rectangular soft ferromagnetic flux concentrators, a serpentine compensating coil, a connecting circuit, and a collection of bond pads used for electrical connections. The MR sensor units are interconnected in order to form a push-pull sensor bridge. The collection of MR sensor units is disposed below the gap between two adjacent soft ferromagnetic flux concentrators. The serpentine compensating coil is disposed above the MR sensor units and below the level of the gap between the two adjacent soft ferromagnetic flux concentrators and below the concentrators in the region between the sensors. The serpentine compensating coil has a positive current strap over the MR sensor units and a negative current strap under the soft ferromagnetic flux concentrators. The MR sensor bridge and the serpentine compensating coil are connected through the bond pads and covered with an encapsulation structure.

Preferably, the magnetoresistive sensor is placed on a PCB substrate to form a sensor chip, the PCB substrate includes a spiral initialization coil, the sensor chip is disposed at the top of the spiral initialization coil, and the direction of a current of the MR sensor bridge flowing through the spiral initialization coil is parallel to the direction of a sensitive axis of the sensor chip.

The PCB substrate further includes lead pads and conductive traces which are used for interconnecting the MR sensor units in order to form a push-pull sensor bridge, some of the lead pads are disposed at the bottom of the PCB substrate, and the sensor chip and the lead pads at the top of the PCB substrate are encapsulated by use of plastic or resin.

Preferably, the MR sensor units are interconnected in order to form a push-pull full bridge circuit.

Preferably, the magnetoresistive sensor has an LGA encapsulation structure.

Preferably, the magnetoresistive sensor includes an application-specific integrated circuit (ASIC), and the ASIC is electrically connected to the sensor bridge.

Preferably, a lead frame is used, and the magnetoresistive sensor is disposed on the lead frame.

Preferably, the lead frame is encapsulated in plastic.

Preferably, the magnetoresistive sensor further includes a first insulation layer, a second insulation layer, and a passivation layer. The collection of MR magnetoresistive elements is covered with the first insulation layer, the serpentine compensating coil is covered with the second insulation layer, and the passivation layer is deposited on the entire sensor chip.

The magnetoresistive sensor of the present invention has smaller size, lower cost, increased dynamic range, improved linearity, and decreased hysteresis. The design allows the magnetic sensor to be easily operated in a closed loop mode.

BRIEF DESCRIPTION OF THE DRAWINGS

In order to illustrate the technical solutions in the embodiments of the present invention or the prior art more clearly, the accompanying drawings required for describing the embodiments or the prior art are introduced briefly below. Obviously, the accompanying drawings in the following description are only some embodiments of the present invention. Those of ordinary skill in the art can obtain other drawings according to the accompanying drawings without creative efforts.

DETAILED DESCRIPTION

In order to make the objectives, technical solutions and advantages of the embodiments of the present invention clearer, the technical solutions in the embodiments of the present invention are described clearly and completely below with reference to the accompanying drawings in the embodiments of the present invention. Obviously, the described embodiments are merely some, rather than all, of the embodiments of the present invention.

Figure 1:
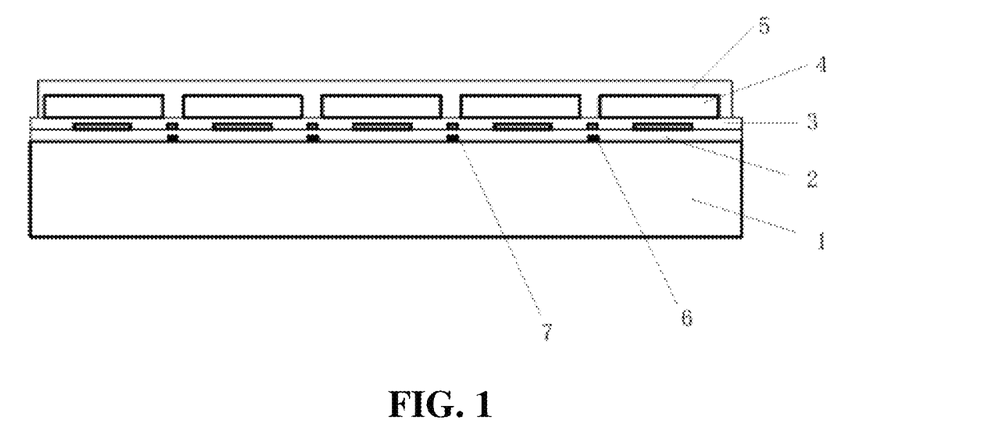
FIG. 1 is a schematic diagram of distribution of a magnetoresistive sensor with a compensating coil according to the present invention.

FIG. 1 is a schematic diagram of distribution of a magnetoresistive sensor with a compensating coil according to the present invention. The magnetoresistive sensor includes a silicon substrate 1, a collection of rectangular soft ferromagnetic flux concentrators 4, a first insulation layer 2, a second insulation layer 3, a collection of MR sensor units 6, a serpentine compensating coil 7, and a passivation layer 5. The MR sensor units 6 are interconnected in order to form a push-pull sensor bridge. The collection of MR sensor units 6 is disposed below the gap between two adjacent soft ferromagnetic flux concentrators 4. The serpentine compensating coil 7 is disposed above the MR sensor units 6 and below the gap between the two adjacent soft ferromagnetic flux concentrators 4. The serpentine compensating coil 7 has a positive current strap over the MR sensor units 6 and a negative current strap under the rectangular soft ferromagnetic flux concentrators. The MR sensor bridge and the serpentine compensating coil are connected through bond pads and covered with an encapsulation structure. The collection of MR sensor units 6 is covered with the first insulation layer 2. The serpentine compensating coil 7 is covered with the second insulation layer 3. The passivation layer 5 is deposited on the entire sensor chip.

Figure 2:
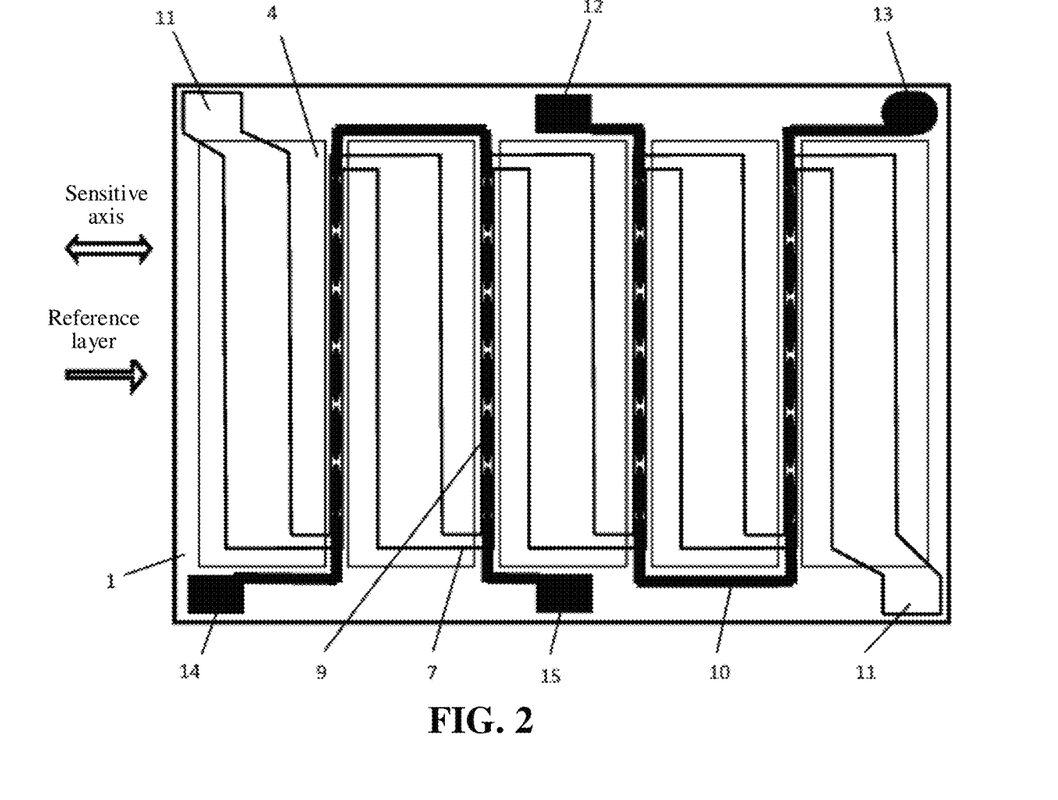
FIG. 2 is a schematic top view of distribution of a magnetoresistive sensor with a compensating coil according to the present invention.

FIG. 2 is a schematic top view of distribution of a magnetoresistive sensor with a compensating coil according to the present invention, wherein 10 represents a connecting line that connects MR sensor units, 11 represents a tickler coil contact electrode, 12 represents a negative contact electrode of an MR sensor bridge, 13 represents a positive contact electrode of the MR sensor bridge, 14 represents a positive contact electrode of another MR sensor bridge, and 15 represents a negative contact electrode of the another MR sensor bridge. The collection of MR sensor units is disposed in the gap between the rectangular soft ferromagnetic flux concentrators, and the MR sensor units are electrically connected. The MR sensor bridges and the serpentine compensating coil are connected through the lead pads and covered with an encapsulation structure.

Figure 3:
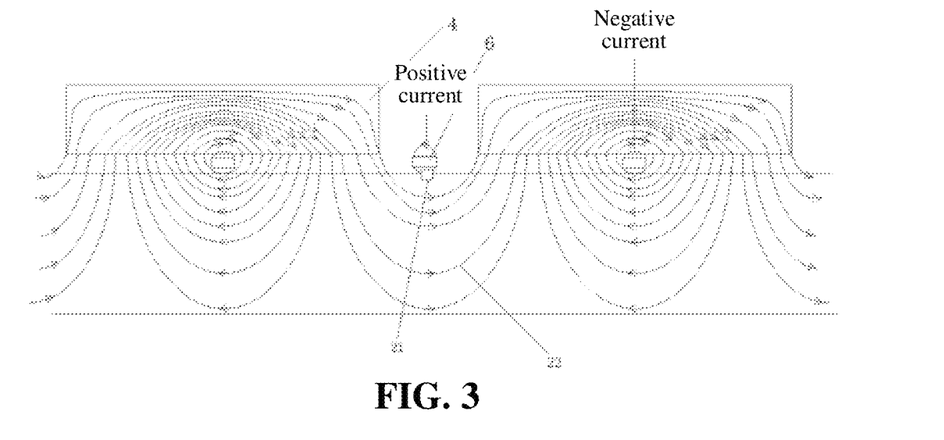
FIG. 3 is a schematic diagram of simulated flux lines of a magnetoresistive sensor with a compensating coil according to the present invention.

FIG. 3 is a schematic diagram of simulated magnetic field lines of a magnetoresistive sensor with a compensating coil according to the present invention, wherein 21 represents that an MR sensor assembly consisting of MR sensor units is located below a position where a serpentine compensating coil produces a positive current, and 22 represents magnetic field lines. As shown in FIG. 3, rectangular soft ferromagnetic flux concentrators are disposed at the upper end of the serpentine compensating coil, and as the current flows in a direction as shown in the figure, the rectangular soft ferromagnetic flux concentrators produce a rightward magnetic field. Similarly, the MR sensor assembly is disposed below the rectangular soft ferromagnetic flux concentrators and has an opposite current polarity at the gap of the serpentine compensating coil. With such an arrangement, the magnetic field of the MR sensor assembly from the serpentine compensating coil is also rightward. When the gap between the rectangular soft ferromagnetic flux concentrators is small enough, the rightward magnetic field above the rectangular soft ferromagnetic flux concentrators is concentrated on the MR sensor assembly located in the gap, thus increasing the magnetic field of the serpentine compensating coil at the MR sensor assembly. This arrangement mode enhances the magnetic field of the serpentine compensating coil and improves efficiency of the serpentine compensating coil.

Figure 4:
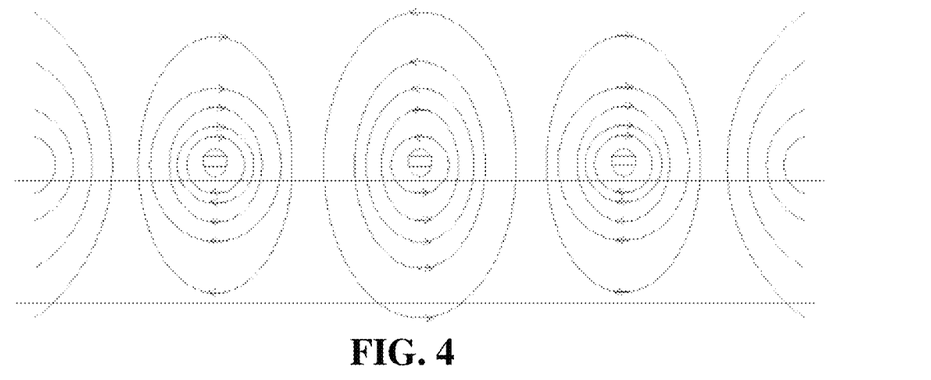
FIG. 4 is a schematic diagram of magnetic field lines in the absence of rectangular soft ferromagnetic flux concentrators according to the present invention.

FIG. 4 is a schematic diagram of magnetic field lines in the absence of rectangular soft ferromagnetic flux concentrators. As shown in the figure, the distribution of magnetic fields is different in the absence of rectangular soft ferromagnetic flux concentrators. The magnetic field of the serpentine compensating coil located between the MR sensor units is not added to the magnetic field of the MR sensor units, and a magnetic field gain is smaller than that of the magnetic field at the position where the MR magnetoresistive element is located. Therefore, the efficiency is low.

Figure 5:
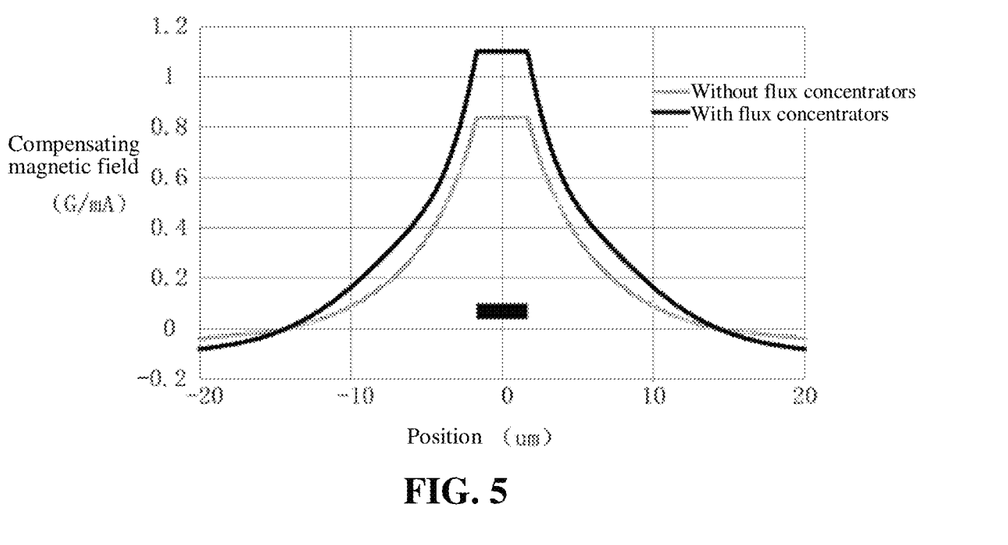
FIG. 5 is a schematic diagram of comparison between magnetic field gains of a serpentine compensating coil according to the present invention.

FIG. 5 is a schematic diagram of comparison between magnetic field gains of a serpentine compensating coil according to the present invention, where the dark color represents a schematic diagram of a magnetic field gain of the serpentine compensating coil in the presence of rectangular soft ferromagnetic flux concentrators, and the magnetic field gain in the middle of the magnetoresistive sensor is greater than 1 G/mA; the light color represents a schematic diagram of a magnetic field gain of the serpentine compensating coil in the absence of rectangular soft ferromagnetic flux concentrators, and the magnetic field gain in the middle of the MR magnetoresistive sensor is about 0.8 G/mA. Therefore, it can be seen from the figure that the rectangular soft ferromagnetic flux concentrator greatly influences the magnetic field gain of the serpentine compensating coil, and the rectangular soft ferromagnetic flux concentrators can improve the magnetic field efficiency of the serpentine compensating coil.

Figure 6:
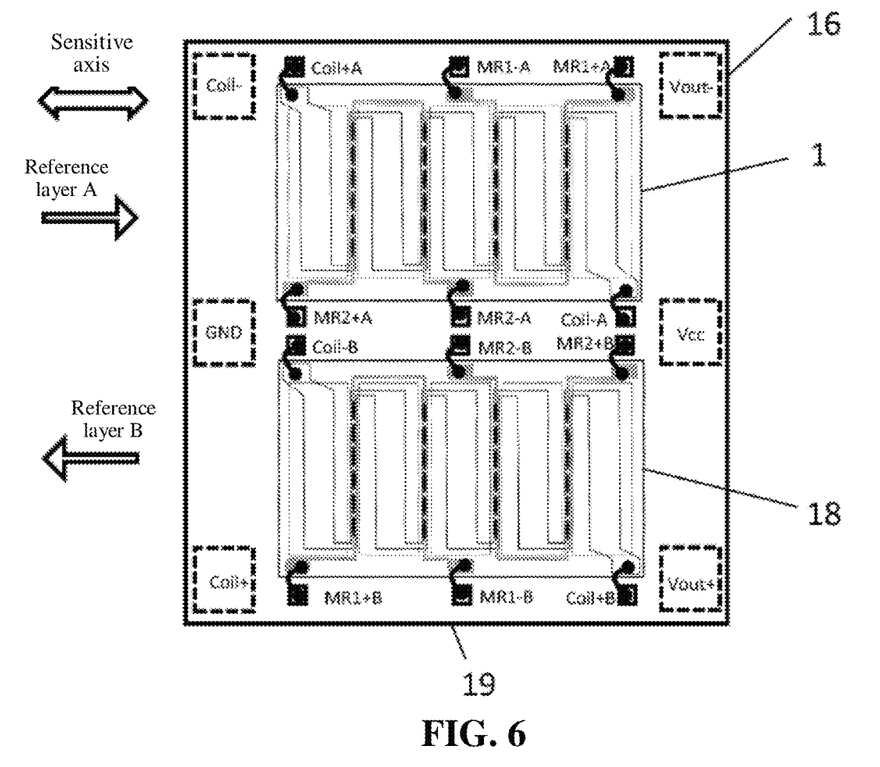
FIG. 6 is a schematic diagram of an LGA encapsulation according to Embodiment 1 of the present invention.

FIG. 6 is a schematic diagram of an LGA encapsulation according to Embodiment 1 of the present invention, wherein 16 represents lead pads on the back of a substrate, and on the back of the magnetoresistive sensor, 17 represents a chip A, and 18 represents a chip B. The chip B is obtained by turning the chip A by 180 degrees. The PCB has an LGA encapsulation form. It can be seen from the figure that a pinning direction of a reference layer of the chip A is from left to right, while a pinning direction of a reference layer of the chip B is opposite to that of the chip A. The chip A and the chip B each consist of a sensor bridge formed by a collection of MR sensor units, a collection of rectangular soft ferromagnetic flux concentrators, and so on. The MR sensor units are interconnected in order to form a push-pull sensor bridge, and the collection of MR sensor units is disposed below the gap between two adjacent soft ferromagnetic flux concentrators.

Figure 7:
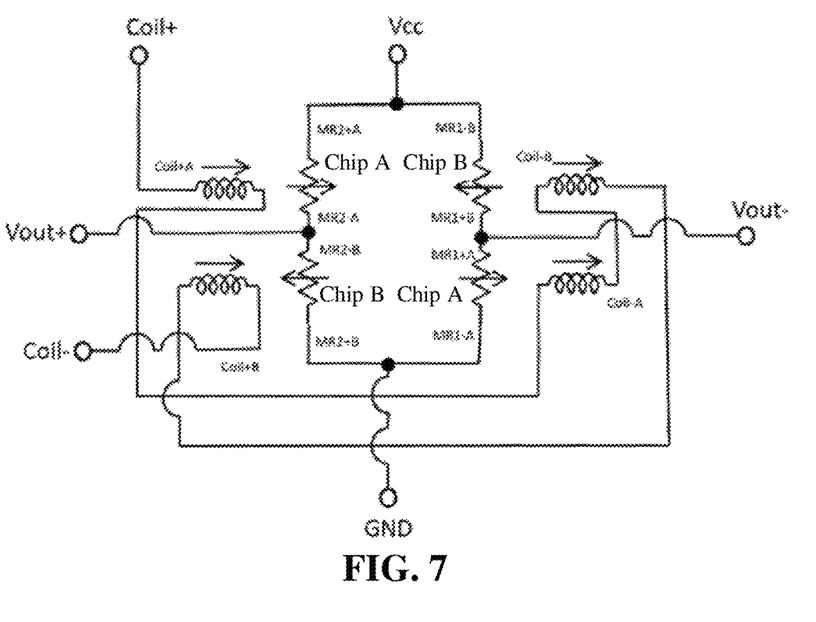
FIG. 7 is a schematic circuit diagram of an LGA encapsulation according to Embodiment 1 of the present invention.

FIG. 7 is a schematic circuit diagram of an LGA encapsulation according to Embodiment 1 of the present invention. It can be seen from the figure that the chip A and the chip B form a full bridge circuit; a current direction of a compensating coil A disposed above the chip A is the same as that of the chip A, and a current direction of a compensating coil disposed above the chip B is the same as that of the chip B.

Figure 8:
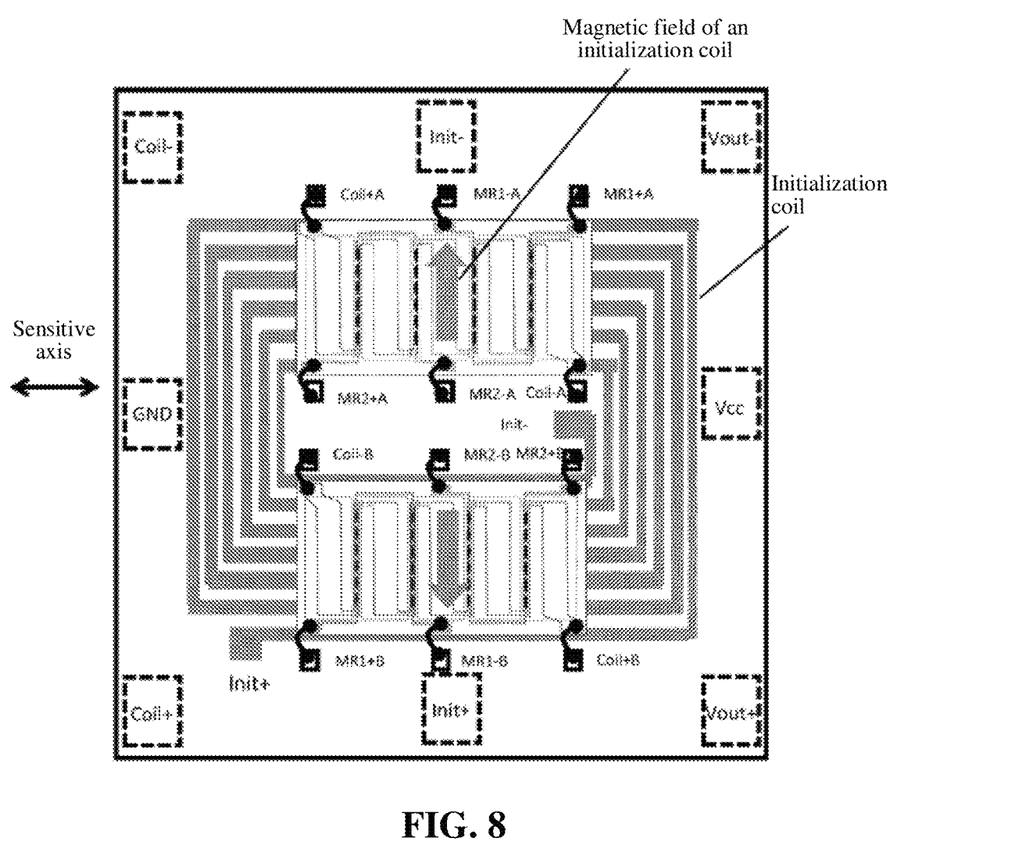
FIG. 8 is a schematic diagram of an LGA encapsulation using an initialization coil according to Embodiment 2 of the present invention.

FIG. 8 is a schematic diagram of an LGA encapsulation using a spiral initialization coil according to Embodiment 2 of the present invention. Embodiment 2 further includes a spiral initialization coil on the basis of Embodiment 1. The spiral initialization coil produces opposite magnetic fields on a chip A and a chip B. The magnetic fields produced by the spiral initialization coil are orthogonal to the magnetic field of the serpentine compensating coil. The magnetoresistive sensor is placed on a PCB substrate to form a sensor chip. The PCB substrate includes the spiral initialization coil. The sensor chip is disposed at the top of the spiral initialization coil. The direction of a current of the MR sensor bridge flowing through the spiral initialization coil is parallel to the direction of a sensitive axis of the sensor chip.

The PCB substrate further includes lead pads and conductive traces which are used for interconnecting the MR sensor units in order to form a push-pull sensor bridge. There are also lead pads disposed at the bottom of the PCB substrate. The sensor chip and the bond pads at the top of the PCB substrate are encapsulated by use of plastic or resin.

Figure 9:
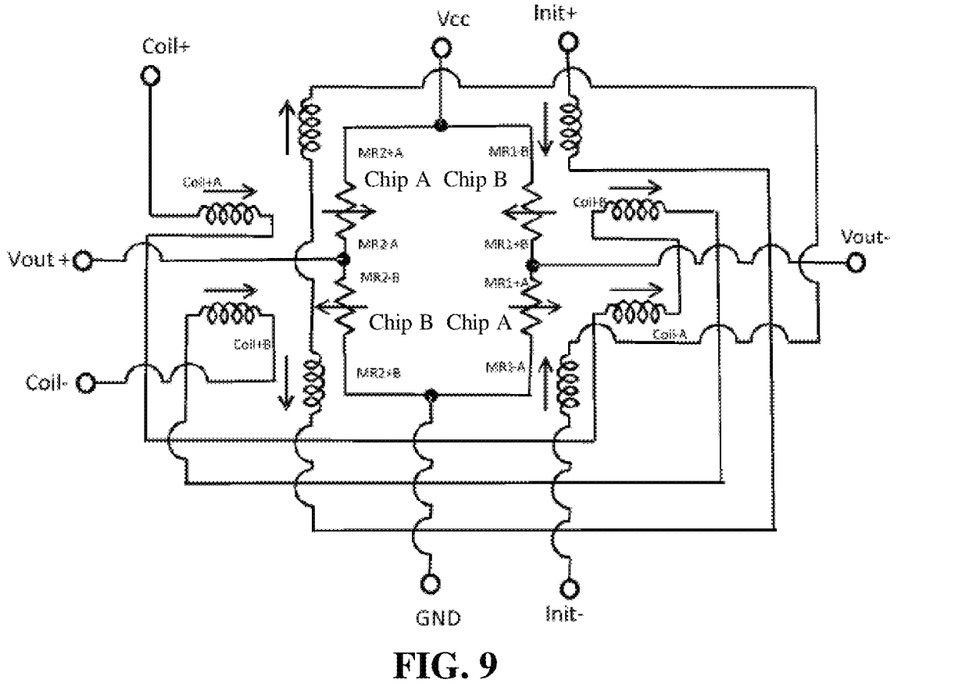
FIG. 9 is a schematic circuit diagram of an LGA encapsulation using an initialization coil according to Embodiment 2 of the present invention.

FIG. 9 is a schematic circuit diagram of an LGA encapsulation using a spiral initialization coil according to Embodiment 2 of the present invention. As shown in the figure, the chip A and the chip B form a full bridge circuit; a current direction of a compensating coil A disposed above the chip A is the same as that of the chip A, and a current direction of a compensating coil disposed above the chip B is the same as that of the chip B. Magnetic fields generated by the initialization coil and the compensating coil are orthogonal to each other.

All other embodiments obtained by those of ordinary skill in the art based on the embodiments of the present invention without creative efforts should fall within the protection scope of the present invention. Although preferred implementations are described schematically in the present invention, those skilled in the art should understand that various changes and modifications can be made on the present invention without exceeding the scope defined by the claims of the present invention.

The invention claimed is:

1. A magnetoresistive sensor, comprising:
   a silicon substrate;
   a collection of MR sensor units on the silicon substrate;
   a collection of rectangular soft ferromagnetic flux concentrators in a parallel arrangement, wherein adjacent ones of the soft ferromagnetic flux concentrators define a gap between the adjacent ones of the soft ferromagnetic flux concentrators, and the MR sensor units are directly below the gaps;
   a serpentine compensating coil above the MR sensor units and below the gap between the adjacent ones of the soft ferromagnetic flux concentrators, the serpentine compensation coil having parallel linear segments, the parallel linear segments including a corresponding linear segment under corresponding ones of the soft ferromagnetic flux concentrators and the gaps, wherein the serpentine compensating coil is configured for current to flow in a first direction in the linear segments under each of the soft ferromagnetic flux concentrators and in a second direction opposite the first direction under each of the gaps;
   a connecting circuit interconnecting the MR sensor unites to form a push-pull sensor bridge;
   a collection of lead pads used for electrical connections to the serpentine compensating coil and the push-pull bridge; and
   an encapsulation structure configured to cover the push-pull sensor bridge and the serpentine compensation coil.

2. The magnetoresistive sensor according to claim 1, wherein the magnetoresistive sensor is placed on a PCB substrate to form a sensor chip, wherein the PCB substrate comprises a spiral initialization coil, wherein the sensor chip is the spiral initialization coil, and wherein the direction of a current flowing through the spiral initialization coil is parallel to the direction of a sensitive axis of the sensor chip.

3. The magnetoresistive sensor according to claim 2, wherein the PCB substrate further comprises lead pads and conductive traces which are used to interconnect the MR sensor units to form the push-pull sensor bridge, wherein these lead pads are disposed at the bottom of the PCB substrate while the sensor chips and the lead pads at the top of the PCB substrate are encapsulated using plastic or resin.

4. The magnetoresistive sensor according to claim 1, wherein the push-pull sensor bridge is a push-pull full bridge circuit.

5. The magnetoresistive sensor according to claim 1, wherein the magnetoresistive sensor has an LGA encapsulation structure.

6. The magnetoresistive sensor according to claim 1, comprising an application-specific integrated circuit (ASIC), wherein the ASIC is electrically connected to the push-pull sensor bridge.

7. The magnetoresistive sensor according to claim 1, wherein the magnetoresistive sensor is disposed on a lead frame.

8. The magnetoresistive sensor according to claim 7, wherein the lead frame is encapsulated in plastic.

9. The magnetoresistive sensor according to claim 1, further comprising:
   a first insulation layer;
   a second insulation layer; and
   a passivation layer,
   wherein the collection of MR sensor units is covered with the first insulation layer,
   wherein the serpentine compensating coil is covered with the second insulation layer, and
   wherein the passivation layer is deposited on the entire sensor chip.

10. A magnetoresistive sensor, comprising:
a silicon substrate;
a push-pull sensor bridge, the sensor bridge including a plurality of MR sensor units on the silicon substrate;
a first insulation layer over the plurality of MR sensor units;
a serpentine compensating coil on the first insulating layer;
a second insulating layer over the compensation coil;
a plurality of flux concentrators comprising a soft ferromagnetic material, the flux concentrators having a rectangular shape with a long axis and being in a parallel arrangement to define gaps between adjacent ones of the flux concentrators, wherein the gaps are directly over the MR sensor units; and
lead pads configured to provide electrical connections to the compensation coil and the sensor bridge,
wherein the compensation coil includes parallel conductor segments, the parallel conductor segments being parallel to the long axes of the flux concentrators, wherein corresponding ones of the conductor segments are under corresponding ones of the flux concentrators and the gaps, and
wherein the parallel conductor segments are electrically-connected to enable current flowing in the compensation coil to flow in a first direction under the flux concentrators and in an opposite second direction under the gaps.

11. The magnetoresistive sensor according to claim 10, wherein the magnetoresistive sensor is placed on a PCB substrate to form a sensor chip,
wherein the PCB substrate comprises a spiral initialization coil,
wherein the sensor chip is the spiral initialization coil, and
wherein the direction of a current flowing through the spiral initialization coil is parallel to the direction of a sensitive axis of the sensor chip.

12. The magnetoresistive sensor according to claim 10, wherein the push-pull sensor bridge is a push-pull full bridge circuit.

13. The magnetoresistive sensor according to claim 10, wherein the magnetoresistive sensor has an LGA encapsulation structure.

14. The magnetoresistive sensor according to claim 10, comprising an application-specific integrated circuit (ASIC), wherein the ASIC is electrically connected to the push-pull sensor bridge.

* * * * *